United States Patent [19]

Purdes et al.

[11] Patent Number: 4,681,653
[45] Date of Patent: Jul. 21, 1987

[54] PLANARIZED DIELECTRIC DEPOSITED USING PLASMA ENHANCED CHEMICAL VAPOR DEPOSITION

[75] Inventors: Andrew J. Purdes; Gregory C. Smith, both of Garland, Tex.

[73] Assignee: Texas Instruments Incorporated, Dallas, Tex.

[21] Appl. No.: 837,878

[22] Filed: Mar. 6, 1986

Related U.S. Application Data

[63] Continuation of Ser. No. 616,517, Jun. 1, 1984, abandoned.

[51] Int. Cl.$^4$ .............................................. C30B 25/06
[52] U.S. Cl. ..................... 156/614; 156/643; 156/DIG. 89; 204/164; 427/39
[58] Field of Search ....... 156/614, DIG. 64, DIG. 89, 156/643, 613; 427/39, 95; 204/164

[56] References Cited

U.S. PATENT DOCUMENTS

| | | | |
|---|---|---|---|
| 4,377,437 | 3/1983 | Taylor et al. | 156/655 X |
| 4,401,687 | 8/1983 | Rosler et al. | 427/39 X |
| 4,407,851 | 10/1983 | Kurosawa et al. | 427/39 |
| 4,446,168 | 5/1984 | Kato et al. | 427/39 |
| 4,461,237 | 7/1984 | Hinkel et al. | 427/39 X |
| 4,463,868 | 12/1982 | Takasaki et al. | 156/653 X |
| 4,478,173 | 10/1984 | Doehler | 427/39 X |
| 4,492,736 | 1/1985 | Tanner | 427/39 |
| 4,496,450 | 1/1985 | Hitotsuyanagi et al. | 427/39 |
| 4,515,652 | 5/1985 | Gimpelson et al. | 156/643 |

OTHER PUBLICATIONS

C. Y. Ting et al., Study of Planarized Sputter-Deposited $SiO_2$, J. Vac. Sci. Technol., 15(3) May/Jun. 1978, pp. 1105-1112.

J. L. Vossen et al, Processes for Multilevel Metalization, J. Vac. Sci. Technol., vol. 11, No. 1, Jan./Feb. 1974, pp. 60-68.

M. J. Nobles et al, The Equilibrium Topography of Sputtered Amorphous Solids, Journal of Materials Science 4 (1969) 730-733.

*Primary Examiner*—David L. Lacey
*Attorney, Agent, or Firm*—Carlton H. Hoel; Leo N. Heiting; Melvin Sharp

[57] ABSTRACT

Deposition in an RIE type plasma reactor of interlevel oxide at high power and low pressure yielding a topography similar to reflowed PSG is disclosed. Deposition rates and film purity are limited by purity and the rate of flow of reactant gases through the plasma reactor and not by the thermal conductivity and expansion properties of quartz as in bias sputtering.

7 Claims, 4 Drawing Figures

U.S. Patent     Jul. 21, 1987     4,681,653
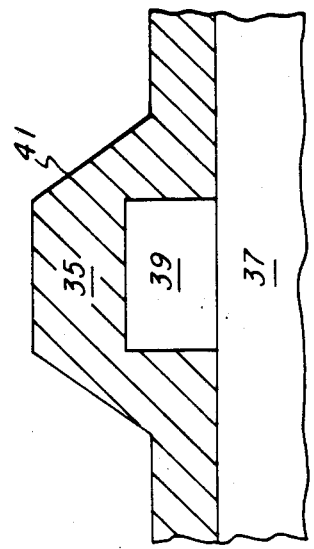
Fig.3
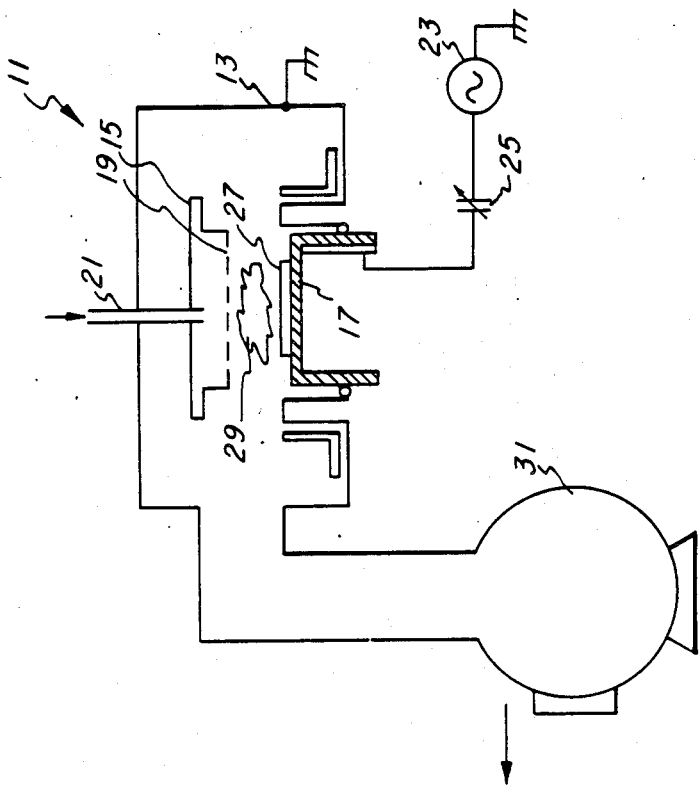
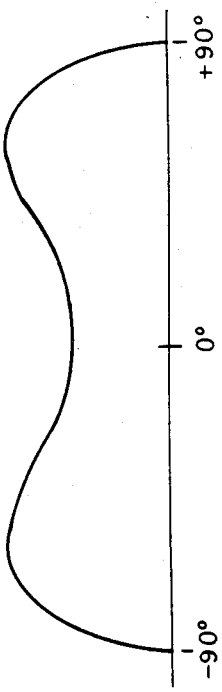
Fig.4
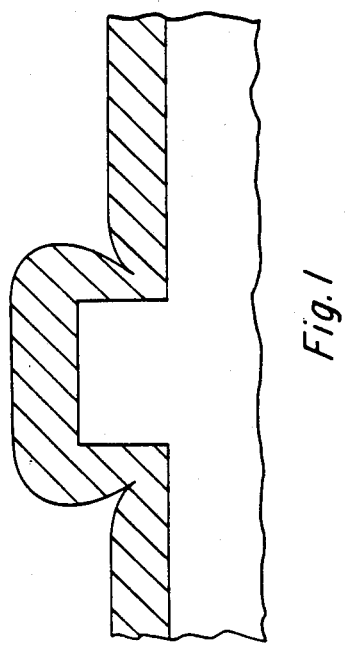
Fig.1
Fig.2

PLANARIZED DIELECTRIC DEPOSITED USING PLASMA ENHANCED CHEMICAL VAPOR DEPOSITION

This application is a continuation application Ser. No. 616,517, filed June 1, 1984, now abandoned.

BACKGROUND OF THE INVENTION

This invention relates to the fabrication of semiconductor devices, and, more particularly, to the deposition of dielectric during the fabrication.

Fabrication of semiconductor devices, especially integrated silicon circuits, generally involves deposition of layers of dielectric (e.g., silicon dioxide) on non-silicon surfaces of the in-process device. Frequently, other materials such as metals, polysilicon, etc. will be deposited upon this layer of dielectric. Commonly, plasma enhanced chemical vapor deposition (PECVD) is used to deposit the dielectric.

Problems arise, however, when the dielectric must be deposited on non-planar portions of the in-process device; for example, when metallization must be covered. Indeed, the PECVD of silicon dioxide on a rectangular step leads to a "bread loafed" deposition topography with the silicon dioxide forming an overhead and self-shadowing deposition at the base of the step (see FIG. 1 for a schematic cross sectional view). Various solutions to the poor topography of PECVD have been proposed and include PSG Reflow where the dielectric is chosen to be phosphosilicate glass (PSG). The PSG is deposited in any convenient fashion, and the deposited layer (together with the in-process device) is heated to about 1000° C. which causes the PSG layer to flow and thereby smooth out any poor topography. See, for example, J. Vossen et al., 11 J. Vac. Sci. Tech. 60 (1974) where PSG Reflow and other methods of topography smoothing are considered. The problems with PSG Reflow include the high reflow temperature which may affect other components of the in-process device such as doped aluminum, and the migration of phosphorous out of the PSG during the high temperature reflow affects doping levels in adjacent materials. Use of higher phosphorous content PSG will lower the reflow temperature, but this will lead to metal corrosion problems for any metallization adjacent to the PSG.

Another approach to smooth topography is spin on glass. Various glasses are available in solution at room temperatures and can be spun onto an in-process device and used as the dielectric. After spin on, baking and densification steps are required, but even the densified glass has poor dielectric properties.

A further approach to smooth topography appears in Adams and Capio, Planarization of Phosphorous-doped Silicon Dioxide, 128 J. Electrochem. Soc. 423 (1981). This approach is initially the same as PSG Reflow, in that a dielectric layer is deposited and then a smoothing step follows. But rather than heating the dielectric to reflow as with PSG Reflow, a photoresist is spun onto the in-process device and forms a smooth surface. Following this spin on and curing of the photoresist, an etchant is applied which will etch the photoresist and the dielectric at approximately the same rate, thus the smooth surface of the photoresist, in effect, propagates down until no photoresist or non-smooth dielectric remains. The etching may be done by means of a $CF_4$-$O_2$ plasma and avoids the high temperature that PSG Reflow requires. This process works well, but the multiple steps required limits its practicality.

Bias sputtering of quartz provides another resolution to the topography problem. As described in C. Ting et al., Study of Planarized Sputter-deposited $SiO_2$, 15 J. Vac. Sci. Tech. 1105 (1978), sputter deposition of quartz together with simultaneous back sputter of the deposited quartz in an Argon RF plasma can lead to a smooth topography of the deposited quartz. The smoothness results from the angular dependence of the back sputtering rate: see FIG. 2 which is a graph of the removal rate by back sputtering as a function of the angle between the normal to the quartz surface being removed and the direction of the incident ions (e.g., Argon) from the plasma. See, M. Nobes et al., 4 J. Mat. Sci. 730 (1969). By varying the split of RF power between the quartz target (deposition sputtering) and the substrate (back sputtering), the contours of the deposited quartz surface can be controlled. However, such bias sputtering has problems including a low deposition rate and target purity. The deposition rate is limited by the heat dissipation capacity of the quartz target.

Thus, there is a problem in the prior art in that a simple (single step) high deposition rate method of depositing dielectrics such as silicon dioxide with smooth topography and high purity is not available.

SUMMARY OF THE INVENTION

The present invention provides a preferred embodiment method and apparatus for plasma enhanced chemical vapor deposition of silicon dioxide on a substrate at high RF power levels to achieve simultaneous back sputtering for topography smoothing. The deposition is performed in a reactor with shower head gas introduction for uniform oxide deposition. Further, the substrate electrode being the smaller of the electrodes and biased to about −900 volts (either directly or by a blocking capacitor in the RF exitation circuit) will increase the ion bombardment on the substrate and increase the rate of the planarizing back sputtering. Also, the use of reactant gases (instead of a quartz target as in bias sputtering) leads to higher purity and better layer integrity than with bias sputtering because the reactant gases (silane and nitrous oxide) are available in higher purity than quartz sputtering targets and deposition and flaking of oxide on the moving parts and baffles of a sputtering system are avoided.

Thus the problems of the prior art of a simple and high deposition rate method and apparatus for depositing silicon dioxide (or other dielectrics) are solved.

BRIEF DESCRIPTION OF THE DRAWINGS

FIG. 1 is a schematic cross section of the "bread loafed" deposition of conventional plasma enhanced chemical vapor deposition of silicon dioxide over a rectangular step;

FIG. 2 shows the dependence of the back sputtering removal rate as a function of the angle between the normal to the surface being removed and the incident ions.

FIG. 3 is a schematic cross section of a first preferred embodiment apparatus for depositing dielectrics such as silicon dioxide with smooth topography; and FIG. 4 is a schematic cross section of silicon dioxide deposited over a rectangular step with the apparatus of FIG. 3.

DETAILED DESCRIPTION OF THE PREFERRED EMBODIMENT

A first preferred embodiment apparatus for practicing the first preferred embodiment method is illustrated in schematic cross section in FIG. 3 and generally denoted by 11. Apparatus 11 includes a vacuum chamber 13, a top electrode 15 mounted in chamber 13, lower electrode 17 mounted in chamber 13 and electrically isolated therefrom, shower head gas manifold 19 forming a portion of electrode 15, gas inlet 21 connecting to shower head 19 and an RF generator 23 connected through variable capacitor 25 to electrode 17. Substrate 27 is shown in position on electrode 17 for receiving the deposition of dielectric, which we will refer to as silicon dioxide for simplicity. Electrodes 15 and 17 are circular with electrode 17 having a diameter of about 15 cm and electrode 15 being slightly larger. Shower head 19 had a diameter of 15 cm and approximately 400 gas outlets. The vertical separation between electrodes 15 and 17 is preferably about 2.5 cm, although smaller separations can be used to trade off smoother topography for less uniform deposition, and larger separations the converse.

RF generator 23 should be capable of generating 500 watts of power (this translates to a power density of approximately 3 w/cm$^2$ on electrode 17 and substrate 27) at 13.56 MHz. A power density exceeding 0.1 watt per square centimeter is employed to excite plasma 29. To begin deposition, silane (SiH$_4$) and nitrous oxide (N$_2$O) are introduced through inlet 21 (possibly together with a diluent such as Helium or Argon) and out shower head 19 and excited into plasma 29 by RF generator 23. Plasma 29 quickly forms silicon dioxide from the silane and nitrous oxide due to the high power density, and this silicon dioxide deposits on substrates 27; this deposition is like PECVD at a power density 300 times the usual. Use of shower head 19 to disperse the reacting gases avoids non-uniform depositions. Gases are pumped out of chamber 13 by pump 31 at a rate to sustain a pressure of about 65 mTorr in chamber 13 at a flow rate of about 90 sccm. This pressure is about one tenth of the usual PECVD pressure, and the total flow is somewhat smaller than with the usual PECVD. The required flow scales with the initial batch size, but pressure and power density do not. Valves in inlet 21 and in front of pump 31 may be used to adjust the pressure, but are not shown in FIG. 3.

The preferred reactant gases are nitrous oxide and silane. The ratio of nitrous oxide to silane flow should be about ten to one if the reactants are undiluted with an inert carrier gas, and five to one if argon, helium, or another diluent is used. Favorable topographies can be obtained with either undiluted or diluted reactant flows, but good topography is obtained at the lowest power with a helium:nitrous oxide:silane flow ratio of 5:5:1. Here "good topography" is as defined in FIG. 4, where the sidewall slope 41 is about sixty degrees or less, and no region of the oxide near the step 39 is shadowed.

Variable capacitor 25 is adjusted to tune the load, and it acquires a DC bias level of around $-900$ V with respect to electrode 15 and the vacuum, chamber sidewalls, although biases between $-600$ and $-1000$ Volts have been found to be useful in producing good topography. Rather than variable capacitor 25, a separate biasing system could be incorporated into apparatus 11. This negative bias on electrode 17, and thus also on the substrate 27, causes the ions created in plasma (e.g., He+ or ionic fractions of N$_2$O) to bombard the surface of substrate 27, and, in particular, the silicon dioxide being deposited. Because this bombardment produces an angle dependent backsputtering removal from the deposited silicon dioxide, the topography of the resulting silicon dioxide is only gently sloped. FIG. 4 shows a schematic cross-section of silicon dioxide layer 35 deposited on substrate 37 with a rectangular step 39. This angular dependence of the backsputtering removal rate is illustrated in FIG. 2 where the backsputtering removal rate is graphed as a function of the angle between the normal to the surface being removed and the direction of the incident ions inducing the removal.

Because the angle between sidewall 41 of layer 35 (see FIG. 4) and the horizontal (or, equivalently, the angle between the normal to sidewall 41 and the vertical direction of the incident ion bombardment from plasma 29) will vary as the conditions in chamber 13 vary, different angles can be selected by adjusting the conditions. The following Table illustrates the angle of sidewall 41 under various conditions used with apparatus 11, the total flow being 88 sccm and the bias on electrode 17 relative to electrode 15 being $-600$ to $-900$ volts.

| RF POWER DENSITY (w/cm$^2$) | GAS PRESSURE (mTorr) | GAS FLOW (sccm) | | | ELECTRODE SPACING (cm) | SIDEWALL Angle (degrees) |
|---|---|---|---|---|---|---|
| | | SiH$_4$ | N$_2$O | He | | |
| 1.1 | 65 | 8 | 80 | 0 | 2.5 | 85 |
| 1.7 | 65 | 8 | 80 | 0 | 2.5 | 85 |
| 2.3 | 65 | 8 | 80 | 0 | 2.5 | 63 |
| 2.8 | 65 | 8 | 80 | 0 | 2.5 | 60 |
| 2.8 | 65 | 8 | 80 | 0 | 2.5 | 60 |
| 2.8 | 120 | 8 | 80 | 0 | 2.5 | 58 |
| 2.8 | 160 | 8 | 80 | 0 | 2.5 | 63 |
| 2.8 | 200 | 8 | 80 | 0 | 2.5 | 75 |
| 2.8 | 65 | 8 | 80 | 0 | 1.0 | 45 |
| 2.8 | 65 | 8 | 80 | 0 | 2.5 | 60 |
| 2.8 | 65 | 8 | 80 | 0 | 3.8 | 65 |
| 2.8 | 65 | 8 | 80 | 0 | 5.0 | 60 |
| 1.1 | 10 | 8 | 40 | 40 | 2.5 | 83 |
| 1.7 | 10 | 8 | 40 | 40 | 2.5 | 70 |
| 2.3 | 10 | 8 | 40 | 40 | 2.5 | 63 |

Deposition rates from the above described operation ranged from 400 to 2000 A/min.

The aforedescribed process could be implemented in production by including a slice loading and unloading mechanism and an input and exit load lock on the vacuum chamber 13, and increasing the deposition rate by increasing the reactant flow and the pumping rate to maintain the pressure at 100 mTorr. Using these means, deposition rates of about 3000 A/min should be easily attainable. Rates of 2000 A/min have been demonstrated in a non-optimized research reactor.

An alternative embodiment of the process would include adding etching gas, such as chlorine or fluorine bearing compounds, to enhance the etchback (backsputter) rate during the deposition. This provides an independent means of controlling the relative deposition and etchback rate, and thus the topography.

Another alternative embodiment method involves its implementation as a batch process in a parallel plate or furnace tube-type plasma reactor. The high ion bombardment energies available in low frequency RF plasmas may reduce the power densities over the substrate required for favorable topography establishment from the levels shown in the Table to levels compatible with batch processing ten or more substrates at a time. As can be seen in the Table, the power density required for favorable topography establishment is reduced by the use of helium diluent and the reduction of the pressure of deposition. If these techniques are used along with the low frequency plasma, batch processing is possible.

Further embodiments include use of different reactant gases to deposit different dielectrics or other materials which can be planarized by backsputtering. For example, $Si_3N_4$ could be deposited by use of silane with ammonia or nitrogen. Similarly, $SiO_xN_y$ could be deposited with silane plus nitrous oxide and ammonia.

What is claimed is:

1. A method of smooth topography deposition of a material onto a substrate, comprising the steps of:
   (a) providing a substrate,
   (b) providing a mixture of gases which react in a plasma to provide a dielectric material for deposit,
   (c) flowing said mixture of gases over said substrate,
   (d) exciting said mixture of gases into a plasma over said substrate to deposit said material onto said substrate, and
   (e) simultaneously backsputtering a portion of said deposited material to provide a backsputtering rate of said deposited material sufficient to obtain a sidewall slope of no more than about sixty degrees,
   (f) wherein said material is silicon dioxide and said gases include silane and nitrous oxide, and
   (g) wherein the pressure of said gases is less than 1000 mTorr; said plasma is excited by an RF power density exceeding 0.1 watt per square centimeter; and the ratio of the flow of nitrous oxide to the flow of silane is about ten.

2. The method of claim 1 wherein said gas includes an etchant.

3. The method of claim 2 wherein said etchant is taken from the class consisting of chlorine compounds and fluorine compounds.

4. A method of smooth topography deposition of a material onto a substrate, comprising the steps of;
   (a) providing a substrate,
   (b) providing a mixture of gases which react in a plasma to provide a dielectric material for deposit,
   (c) flowing said mixture of gases over said substrate,
   (d) exciting said mixture of gases into a plasma over said substrate to deposit said material onto said substrate, and
   (e) simultaneously backsputtering a portion of said deposited material to provide a backsputtering rate of said deposited material sufficient to obtain a sidewall slope of no more than about sixty degrees,
   (f) wherein said material is silicon dioxide and said gases include silane, nitrous oxide and a diluent, and
   (g) wherein the pressure of said gases is less than 1000 mTorr; said plasma is excited by an RF power density exceeding 0.1 watt per square centimeter; and the ratio of the flow of nitrous oxide to the flow of silane is above five, and the ratio of the flow of nitrous oxide to the flow of diluent is about one.

5. The method of claim 4 wherein said diluent is taken from the class consisting of argon and helium.

6. The method of claim 4 wherein said gas includes an etchant.

7. The method of claim 6 wherein said etchant is taken from the class consisting of chlorine compounds and fluorine compounds.

* * * * *